United States Patent
Kando

(10) Patent No.: US 7,522,020 B2
(45) Date of Patent: Apr. 21, 2009

(54) BOUNDARY ACOUSTIC WAVE DEVICE AND METHOD FOR MANUFACTURING BOUNDARY ACOUSTIC WAVE DEVICE

(75) Inventor: Hajime Kando, Ritto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 11/970,079

(22) Filed: Jan. 7, 2008

(65) Prior Publication Data

US 2008/0106354 A1 May 8, 2008

Related U.S. Application Data

(63) Continuation of application No. PCT/JP2006/309328, filed on May 9, 2006.

(30) Foreign Application Priority Data

Jul. 14, 2005 (JP) ............................. 2005-205608

(51) Int. Cl.
*H03H 9/15* (2006.01)
*H03H 9/13* (2006.01)
*H03H 9/54* (2006.01)

(52) U.S. Cl. ...................... 333/193; 333/194; 333/195; 310/313 B

(58) Field of Classification Search ................. 333/193, 333/195; 310/313 A, 313 B, 313 D
See application file for complete search history.

(56) References Cited

U.S. PATENT DOCUMENTS

| 5,633,616 | A | 5/1997 | Goto |
|---|---|---|---|
| 6,437,479 | B1 | 8/2002 | Miura et al. |
| 6,737,941 | B1 * | 5/2004 | Tournois ...................... 333/193 |
| 7,151,424 | B2 | 12/2006 | Kando |
| 7,224,101 | B2 | 5/2007 | Mishima et al. |
| 2006/0071579 | A1 | 4/2006 | Kando |
| 2006/0138902 | A1 | 6/2006 | Kando |
| 2006/0175928 | A1 | 8/2006 | Kando |

FOREIGN PATENT DOCUMENTS

| JP | 05-095249 A | 4/1993 |
|---|---|---|
| JP | 06-037582 A | 2/1994 |
| JP | 08-265089 A | 10/1996 |
| JP | 2000-049559 A | 2/2000 |
| JP | 2000-224000 A | 8/2000 |
| JP | 2003-338730 A | 11/2003 |
| WO | WO 2004/095699 | * 11/2004 |

OTHER PUBLICATIONS

Official communication issued in the International Application No. PCT/JP2006/309328, mailed on Aug. 15, 2006.
Campbell et al., "A Method for Estimating Optimal Crystal Cuts and Propagation Directions for Excitation of Piezoelectric Surface Waves",IEEE Transactions on Sonic and Ultrasonics, vol. 50-15, No. 4, Oct. 1968, pp. 209-217.

* cited by examiner

*Primary Examiner*—Barbara Summons
(74) *Attorney, Agent, or Firm*—Keating & Bennett, LLP

(57) ABSTRACT

A boundary acoustic wave device has a small thickness, which is suitable for thin apparatuses, and can be manufactured at low cost. The boundary acoustic wave device includes a first IDT electrode disposed on a first surface of a substrate, a first insulating film covering the first IDT electrode, a second IDT electrode disposed on a second surface of the substrate, and a second insulating film covering the second IDT electrode. Either the substrate or the first and second insulating films have piezoelectric characteristics.

8 Claims, 6 Drawing Sheets

BOUNDARY ACOUSTIC WAVE DEVICE AND METHOD FOR MANUFACTURING BOUNDARY ACOUSTIC WAVE DEVICE

BACKGROUND OF THE INVENTION

1. Field of the Invention

The present invention relates to boundary acoustic wave devices using boundary acoustic waves propagating along a boundary surface between different media and methods for manufacturing the boundary acoustic wave devices. The present invention particularly relates to a boundary acoustic wave device including a plurality of boundary acoustic wave elements integrated in one chip and a method for manufacturing the boundary acoustic wave device.

2. Description of the Related Art

Surface acoustic wave devices have been widely used for RF band-pass filters for mobile phones. The surface acoustic wave devices include piezoelectric substrates on which surface acoustic waves propagate. Surfaces of the piezoelectric substrates need to have cavities. Therefore, the surface acoustic wave devices have a complicated package structure and a large size.

On the other hand, boundary acoustic wave devices using boundary acoustic waves propagating along a boundary surface between different media have been attracting much attention. Since the boundary acoustic waves propagate along a boundary surface therebetween, the boundary acoustic wave devices need not be packaged so as to have cavities and therefore can be downsized.

Japanese Unexamined Patent Application Publication No. 2004-159262 discloses an exemplary boundary acoustic wave device. FIG. 9 is a front sectional view of the boundary acoustic wave device disclosed in Japanese Unexamined Patent Application Publication No. 2004-159262.

The boundary acoustic wave device 101 includes a first boundary acoustic wave element 102, a second boundary acoustic wave element 103, and a third boundary acoustic wave element 104 in series. The first boundary acoustic wave element 102 includes a first solid layer 102a made of a piezoelectric material; a second solid layer 102c, made of a piezoelectric or insulating material, overlying the first solid layer 102a; and IDT electrodes 102b sandwiched between the first and second solid layers 102a and 102c. The second boundary acoustic wave element 103, as well as the first boundary acoustic wave element 102, includes a first solid layer 103a, a second solid layer 103c, and IDT electrodes 103b sandwiched therebetween. The third boundary acoustic wave element 104, as well as the first boundary acoustic wave element 102, includes a first solid layer 104a, a second solid layer 104c, and IDT electrodes 104b sandwiched therebetween.

In the boundary acoustic wave device 101, the first, second, and third boundary acoustic wave elements 102, 103, and 104 are laminated and therefore can be mounted within a small space on a mounting board. This allows the boundary acoustic wave device and an electronic apparatus including the boundary acoustic wave device to be downsized.

The boundary acoustic wave device 101 has a configuration in which the first, second, and third boundary acoustic wave elements 102, 103, and 104 are arranged in the thickness direction thereof. Therefore, although a space for mounting the boundary acoustic wave device 101 is small, the boundary acoustic wave device 101 has a large thickness and therefore is unsuitable for thin apparatuses.

SUMMARY OF THE INVENTION

In order to overcome the problems described above, preferred embodiments of the present invention provide a boundary acoustic wave device which requires only a small mounting space, which has a small thickness, which is suitable for thin apparatuses, and which can be manufactured at low cost, and a method for manufacturing such a novel boundary acoustic wave device.

According to a preferred embodiment of the present invention, a boundary acoustic wave device includes a substrate having a first surface and a second surface opposed to the first surface, a first IDT electrode disposed on the first surface, a second IDT electrode disposed on the second surface, a first dielectric film extending over the first surface so as to cover the first IDT electrode, and a second dielectric film extending over the second surface so as to cover the second IDT electrode. Either the substrate or the first and second dielectric films have piezoelectric characteristics.

In an aspect of the boundary acoustic wave device according to a preferred embodiment of the present invention, the velocity of a slow transverse wave propagating in the substrate is greater than at least one of the velocity of a slow transverse wave propagating in the first dielectric film and the velocity of a slow transverse wave propagating in the second dielectric film.

In another aspect of the boundary acoustic wave device according to a preferred embodiment of the present invention, at least one of the first and second dielectric films has a surface which is opposed to the substrate and which has a recessed portion and/or a projecting portion.

In another aspect of a preferred embodiment of the present invention, the boundary acoustic wave device further includes a sound-absorbing film disposed on one of the first and second dielectric films.

In another aspect of a preferred embodiment of the present invention, the substrate is piezoelectric and the first and second dielectric films are insulative.

In another aspect of a preferred embodiment of the present invention, the substrate is dielectric and the first and second dielectric films are piezoelectric.

According to another preferred embodiment of the present invention, a method for manufacturing a boundary acoustic wave device includes a step of preparing a wafer, having a first surface and a second surface opposed to the first surface, for forming a plurality of boundary acoustic wave devices; a step of forming a plurality of first IDT electrodes on the first surface of the wafer; a step of forming a plurality of second IDT electrodes on the second surface of the wafer; a step of forming a first dielectric film over the first surface of the wafer such that the first dielectric film covers the first IDT electrodes; a step of forming a second dielectric film over the second surface of the wafer such that the second dielectric film covers the second IDT electrodes; and a step of dicing the wafer subsequently to the formation of the first and second dielectric films to prepare each boundary acoustic wave device.

In the boundary acoustic wave device according to various preferred embodiments of the present invention, the first and second IDT electrodes are disposed on the first and second surfaces, respectively, of the substrate and the first and second dielectric films are also disposed on the first and second surfaces, respectively, of the substrate. That is, the substrate is sandwiched between boundary acoustic wave elements. The boundary acoustic wave device can be manufactured in such a manner that the substrate and the boundary acoustic wave elements are integrated into one. The number of substrates used may be small. This leads to a reduction in manufacturing cost. The boundary acoustic wave device has a composite configuration and however has a small thickness.

The boundary acoustic wave device according to various preferred embodiments of the present invention requires a small mounting space, has a small thickness, and can be manufactured at low cost.

In the boundary acoustic wave device according to various preferred embodiments of the present invention, when the velocity of the slow transverse wave propagating in the substrate is greater than at least one of the velocity of the slow transverse wave propagating in the first dielectric film and the velocity of the slow transverse wave propagating in the second dielectric film, an unwanted spurious mode can be prevented. This improves frequency characteristics of the boundary acoustic wave device.

When the first and/or second dielectric film has the surface, opposed to the dielectric substrate, having the recessed portion and/or the projecting portion, an unwanted spurious mode can be effectively prevented.

When the sound-absorbing film is disposed on one of the first and second dielectric films, a spurious mode can be even more effectively prevented.

When the substrate is piezoelectric and the first and second dielectric films are insulative, boundary acoustic wave element portions can be formed on both surfaces of the substrate. When the substrate is dielectric and the first and second dielectric films are piezoelectric, boundary acoustic wave element portions can be formed on both surfaces of the substrate using piezoelectric characteristics of the first and second dielectric films.

According to the method of a preferred embodiment of the present invention, the boundary acoustic wave device can be efficiently manufactured in such a manner that the wafer is prepared; the first and second IDT electrodes are formed on the first and second surfaces, respectively, of the wafer; and the resulting wafer is then diced. A plurality of boundary acoustic wave element portions can be prepared from the single wafer and the method is simple. This leads to a reduction in the manufacturing cost of the boundary acoustic wave device.

Other features, elements, processes, steps, characteristics and advantages of the present invention will become more apparent from the following detailed description of preferred embodiments of the present invention with reference to the attached drawings.

BRIEF DESCRIPTION OF THE DRAWINGS

FIGS. 3A and 3B show principal responses, and FIGS. 3C and 3D show spurious modes.

FIGS. 5A and 5B show principal responses of boundary acoustic waves, and FIGS. 5C and 5D show spurious modes.

DETAILED DESCRIPTION OF PREFERRED EMBODIMENTS

Preferred embodiments of the present invention will now be described with reference to the accompanying drawings.

Figure 1:
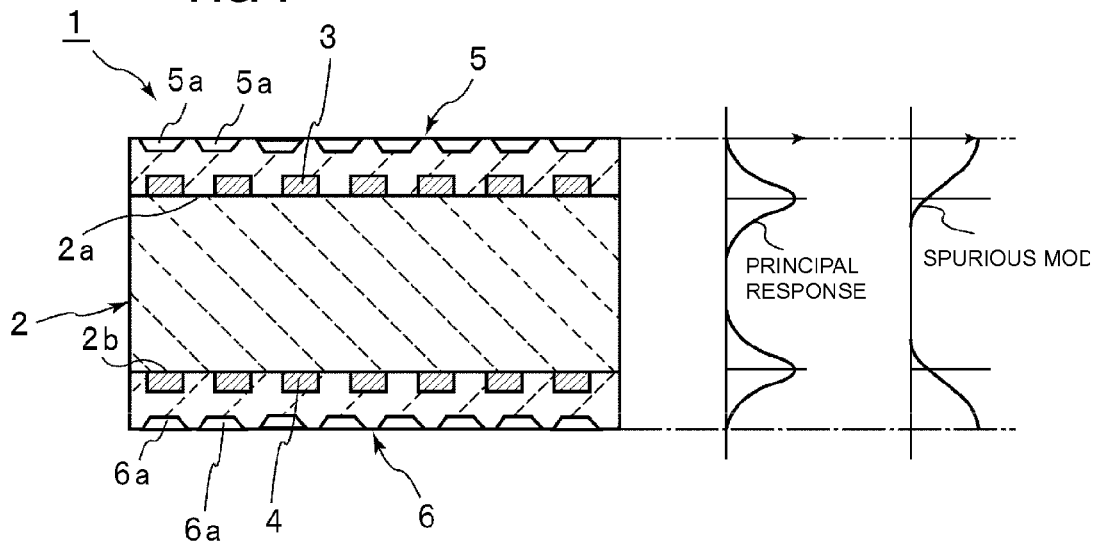
FIG. 1 includes a schematic front sectional view of a boundary acoustic wave device according to a first preferred embodiment of the present invention, an illustration showing the energy distribution of a boundary acoustic wave propagating in the boundary acoustic wave device, and an illustration showing the energy distribution of a spurious mode.

FIG. 1 is a front schematic sectional view of a boundary acoustic wave device according to a first preferred embodiment of the present invention. The following distributions are shown in the right portion of FIG. 1: the vibrational energy distribution of an SH-type boundary acoustic wave used for the boundary acoustic wave device 1 and the energy distribution of a spurious mode.

The boundary acoustic wave device 1 includes a piezoelectric substrate 2. The piezoelectric substrate 2 is not particularly limited and various piezoelectric single-crystals and piezoelectric ceramic materials can be used to form the piezoelectric substrate 2. In this preferred embodiment, the piezoelectric substrate 2 is preferably made of a 15°-rotated Y-cut X-propagation LiNbO₃ single-crystal, for example.

The piezoelectric substrate 2 has a first surface 2a and a second surface 2b opposed to the first surface 2a. A first IDT electrode 3 and a second IDT electrode 4 are disposed on first surface 2a and the second surface 2b, respectively. The first and the second IDT electrode 3 and 4 may be made of metal or alloy. In this preferred embodiment, the first and the second IDT electrode 3 and 4 are preferably made of Au, for example.

The first and the second IDT electrode 3 and 4 may be made of different materials and may have different thicknesses. That is, the first and the second IDT electrode 3 and 4 may be designed such that a boundary acoustic wave element to be formed on the first surface 2a of the piezoelectric substrate 2 and a boundary acoustic wave element to be formed on the second surface 2b thereof have desired characteristics.

The boundary acoustic wave elements to be formed on the first and second surfaces 2a and 2b of the piezoelectric substrate 2 may have different characteristics or the same characteristics.

A first insulating film 5 serving as a first dielectric film extends over the first surface 2a to cover the IDT electrode 3. A second insulating film 6 serving as a second dielectric film extends over the second surface 2b to cover the IDT electrode 4.

The first insulating film 5 may be made of an insulating material and is made of SiO₂ in this preferred embodiment.

The second insulating film 6, as well as the first insulating film 5, may be made of an insulating material and is made of $SiO_2$ in this preferred embodiment.

The first and second insulating films 5 and 6 may be made of different materials. The first and second insulating films 5 and 6 may have the same thickness or different thicknesses.

The boundary acoustic wave device 1 includes the single piezoelectric substrate 2 as described above. The first and second boundary acoustic wave elements are disposed on the first surface 2a and second surface 2b, respectively, of the piezoelectric substrate 2. Since the boundary acoustic wave elements are integrated, a space for mounting the boundary acoustic wave device 1 may be small. Since the piezoelectric substrate 2 is common to the first and second boundary acoustic wave elements, the boundary acoustic wave device 1 has a small thickness and can be manufactured at low cost.

In the boundary acoustic wave device 1, the first and the second IDT electrode 3 and 4 may have a structure suitable for resonators or filters. The boundary acoustic wave device 1 may include a plurality of first IDT electrodes instead of the first IDT electrode 3 and may include a plurality of second IDT electrodes instead of the second IDT electrode 4.

If the first and second boundary acoustic wave elements are configured so as to function as boundary acoustic wave filters having different band-pass frequencies, the boundary acoustic wave device 1 can be used as a filter, such as a two-band filter or duplexer, having band-pass frequencies. Longitudinally coupled two-stage cascaded type filter and ladder filters each including a plurality of filter elements have a large attenuation. Such filter elements can be readily formed densely in the boundary acoustic wave device 1.

If a first longitudinal double-mode coupling filter or a first ladder filter is formed on the first surface 2a and a second longitudinal double-mode coupling filter or a second ladder filter is formed on second surface 2b, a first band-pass filter and second band-pass filter having a large attenuation can be formed on both surfaces of the piezoelectric substrate 2.

The energy distributions of boundary acoustic waves used for the boundary acoustic wave device 1 will now be described.

The energy distribution of the SH-type boundary acoustic wave used for the boundary acoustic wave device 1 is shown in the right portion of FIG. 1. The energy distribution of the spurious mode is also shown in the right portion of FIG. 1.

A vibration mode used for the boundary acoustic wave device propagates such that energy is concentrated on the boundary between the piezoelectric substrate 2 and the first insulating film 5 and the boundary between the piezoelectric substrate 2 and the second insulating film 6. The energy of the vibration mode is concentrated on a portion extending upwardly and downwardly from each boundary by 1λ (see FIG. 1).

Therefore, if the piezoelectric substrate 2 has a thickness of at least about 2λ, a boundary acoustic wave propagating along the first surface 2a can be prevented from being combined with a boundary acoustic wave propagating along the second surface 2b. The piezoelectric substrate 2 preferably has a thickness greater than about 2λ and more preferably about 3λ or more, because the boundary acoustic wave propagating along the first surface 2a can be securely prevented from being combined with the boundary acoustic wave propagating along the second surface 2b.

However, when the piezoelectric substrate 2 has a thickness greater than about 100λ, thickness reduction cannot be achieved although the boundary acoustic waves can be prevented from being combined with each other. In contrast, when the substrate has an excessively small thickness, a wafer for preparing the piezoelectric substrate 2 or a chip including the 2 may be broken because of low mechanical strength. In order to achieve thickness reduction, it is preferable that the thickness of the piezoelectric substrate 2 not be too large. In order to prevent characteristic deterioration due to the combination of the above sounds, the piezoelectric substrate 2 preferably has a thickness of about 3λ to about 100λ. The piezoelectric substrate 2 more preferably has a thickness of about 20λ to about 70λ.

When the boundary acoustic wave device 1 includes boundary acoustic wave filters each disposed on the first surface 2a and the second surface 2b, a boundary acoustic wave propagating along the first surface 2a is acoustically combined with a boundary acoustic wave propagating along the second surface 2b and therefore a spurious mode may be caused by a boundary acoustic wave leaking from one of the boundary acoustic wave filters to the other one. Since the piezoelectric substrate 2 is an isotropic crystal, a mode causing the boundary acoustic waves and/or the spurious mode propagates in the form of a single vibration mode having three components: a P component, an SH component, and an SV component. In a specific symmetric crystal orientation, the SH component only or the P and SV components may propagate.

The SH or SV component has the lowest velocity. A vibration component with a velocity less than that of the SH or SV component is referred to as a "slow transverse wave" component and a vibration component with a velocity greater than that of the SH or SV component is referred to as a "fast transverse wave" component. When a medium is isotropic, a wave propagating in the medium has a single transverse wave component.

A mode causing a spurious response mode is a slow transverse wave. When the slow transverse wave has a velocity less than those of slow transverse waves propagating in the insulating films 5 and 6, the energy of a slow transverse wave component leaks through the first and second surface 2a and 2b. When the slow transverse wave causing the spurious response has a velocity less than that of a fast transverse wave propagating in a medium, the energy of a fast transverse wave component leaks through the first and second surface 2a and 2b. The energy of a longitudinal wave component may also leak therethrough as described above.

In this preferred embodiment, the velocity of a slow transverse wave propagating in the piezoelectric substrate 2 is represented by Vs0, the velocity of a slow transverse wave propagating in the first insulating film 5 is represented by Vs1, and the velocity of a slow transverse wave propagating in the second insulating film 6 is represented by Vs2. When Vs0>Vs1 and Vs0>Vs2, the spurious response-causing mode significantly leaks into the first and second insulating films 5 and 6. Therefore, the sound coupling between boundary acoustic wave propagation paths located on both sides of the piezoelectric substrate 2 is slight. With reference to FIG. 1, the outer surface of the first insulating film 5 has recessed portions 5a and the outer surface of the second insulating film 6 has recessed portions 6a. The recessed portions 5a and 6a are effective in preventing the spurious response-causing mode. The outer surfaces of the first and second insulating films 5 and 6 may have projecting portions instead of or in addition to the recessed portions 5a and 6a. A process for forming the recessed and/or projecting portions is not particularly limited. Alternatively, the outer surfaces of the first and second insulating films 5 and 6 may be wavy instead of having the recessed and/or projecting portions.

In contrast, when Vs0<Vs1 and Vs0<Vs2, the spurious response-causing mode significantly leaks into the piezoelectric substrate 2. A boundary acoustic wave propagating along the first surface 2a is strongly combined with a boundary acoustic wave propagating along the second surface 2b. In this case, the recessed portions 5a and 6a are ineffective in preventing the spurious response-causing mode.

Therefore, it is preferable that Vs0>Vs1, Vs0>Vs2, and the insulating films 5 and 6 have the recessed portions 5a and 6a, respectively, as described above.

Figure 2A:
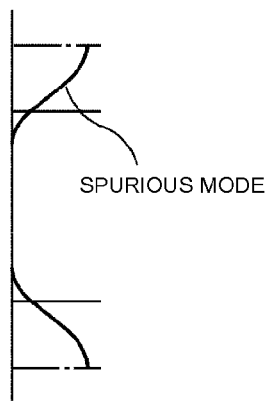
FIG. 2A is an illustration showing the energy distribution of a spurious mode propagating in the boundary acoustic wave device, shown in FIG. 1, according to the first preferred embodiment
Figure 2B:
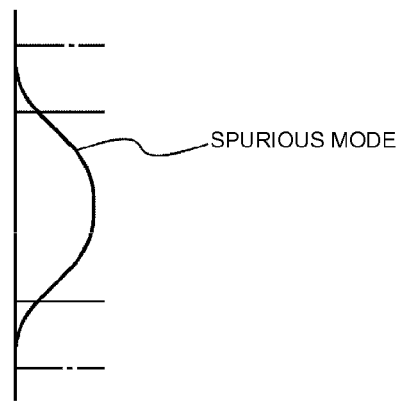
FIG. 2B is an illustration showing the energy distribution of a spurious mode propagating in a comparative boundary acoustic wave device.

FIG. 2A shows the energy distribution of a spurious mode in the boundary acoustic wave device. The energy distribution shown in FIG. 2A is the same as that shown in the rightmost portion of FIG. 1 and is shown for comparison with the vibration energy distribution of a spurious mode in which Vs0<Vs1 and Vs0<Vs2.

FIGS. 3A to 5D show the results obtained by calculating the displacement distributions of film components of boundary acoustic waves propagating in the boundary acoustic wave device 1 and comparative boundary acoustic wave devices. The piezoelectric substrate 2 preferably is made of the 15°-rotated Y-cut X-propagation $LiNbO_3$ single-crystal and is supposed to have a thickness of about 5λ, for example. The first and second insulating films 5 and 6 preferably are made of $SiO_2$ and are supposed to have an infinite thickness, for example. The first and the second IDT electrode 3 and 4 preferably are made of Au and are supposed to have a thickness of about 0.05λ, for example. With reference to FIGS. 3A to 5D, U1 represents a P component, U2 represents an SH component, and U3 represents an SV component. The above results are obtained by a technique disclosed in the following document in such a manner that the displacement of a boundary surface between layers and vertical stress are supposed to be continuous and the potentials of a boundary surface are supposed to be zero: "A Method for Estimating Optimal Cuts and Propagation Directions for Excitation and Propagation Directions for Excitation of Piezoelectric Surface Waves" (J. J. Campbell and W. R. Jones, IEEE, Trans. Sonics and Ultrason., Vol. SU-15 (1968), pp. 209-217).

Figure 3A:
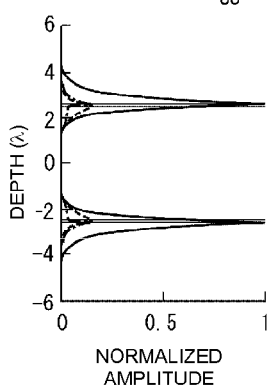
FIGS. 3A to 3D are illustrations showing the energy distributions of components propagating in the boundary acoustic wave device according to the first preferred embodiment.
Figure 3B:
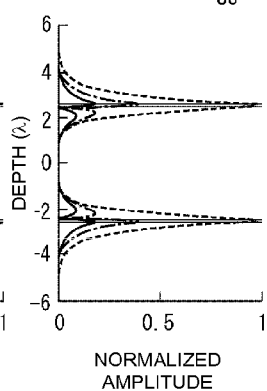

FIGS. 3A and 3B show SH components and SV components of boundary acoustic waves that cause principal response modes. Whether which wave causes a principal response depends on the cutting angle of a $LiNbO_3$ crystal. When the cutting angle is about 15 degrees, the SH component shown in FIG. 3A is predominant. When the cutting angle is about 120 degrees, the P component and SH component shown in FIG. 3B are predominant.

FIGS. 3C, 3D, and 4A to 4D show spurious modes.

A longitudinal wave, fast transverse wave, and slow transverse wave propagating in a rotated Y-cut X-propagation $LiNbO_3$ substrate have a velocity of 6547 m/s, 4752 m/s, and 4031 m/s, respectively. On the other hand, a longitudinal wave and slow transverse wave propagating in a $SiO_2$ substrate have a velocity of 5960 m/s and 3757 m/s, respectively. The velocity of the slow transverse wave propagating in the $SiO_2$ substrate is less than that of the slow transverse wave propagating in the $LiNbO_3$ substrate. Therefore, the vibration energy of the SV component of the slow transverse wave propagating in the $SiO_2$ substrate leaks out of the first and second insulating films 5 and 6.

When the first and second insulating films 5 and 6 have an infinite thickness, sound-absorbing films are each attached to the outer surfaces of the first and second insulating films 5 and 6 as described below in a second preferred embodiment of the present invention, or the outer surfaces of the first and second insulating films 5 and 6 have the recessed portions and/or the projecting portions, a spurious mode can be effectively prevented.

Figure 3C:
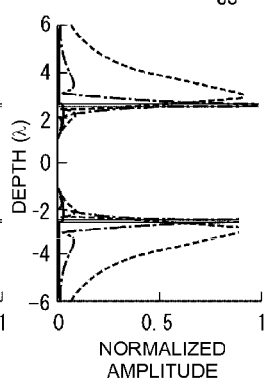
Figure 3D:
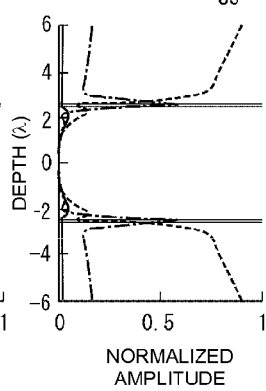
Figure 4A:
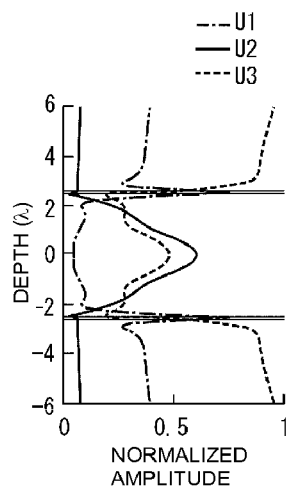
FIGS. 4A to 4D are illustrations showing spurious modes propagating in the boundary acoustic wave device according to the first preferred embodiment.
Figure 4B:
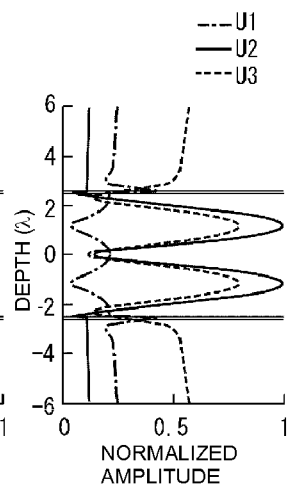
Figure 4C:
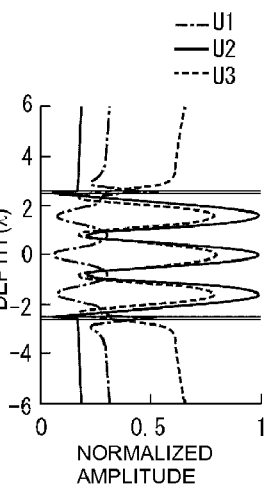
Figure 4D:
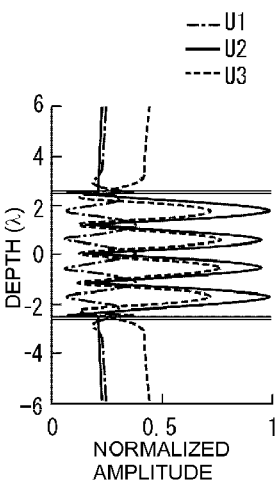

When the first and second insulating films 5 and 6 have a thickness of about 1λ to about 2λ, the spurious modes, shown in FIG. 3C, propagating along the first and second surfaces 2a and 2b can be effectively prevented.

FIGS. 5A to 5D show the results obtained by calculating the displacement distributions of boundary acoustic waves propagating in the comparative boundary acoustic wave devices on the basis that the velocities of slow transverse waves propagating in first and second insulating films are greater than that of a slow transverse wave propagating in a piezoelectric substrate 2. The piezoelectric substrate preferably is made of a 15°-rotated Y-cut X-propagation $LiNbO_3$ crystal and has a thickness of about 4λ, for example. The first and second insulating films preferably are made of SiN and have an infinite thickness, for example. IDT electrodes preferably are made of Au and have a thickness of about 0.05λ, for example.

Figure 5A:
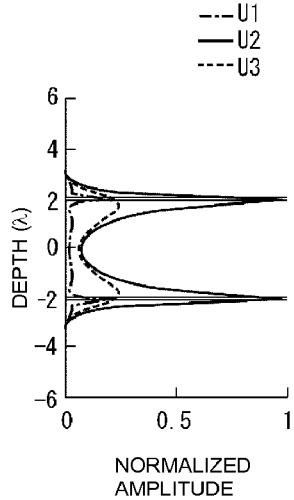
FIGS. 5A to 5D are illustrations showing modes propagating in the comparative boundary acoustic wave device according to the first preferred embodiment.
Figure 5B:
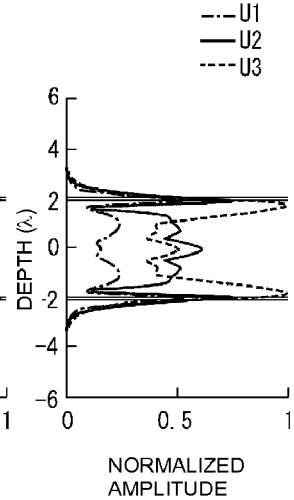

A longitudinal wave and slow transverse wave propagating in SiN have a velocity of 10642 m/s and 5973 m/s, respectively. FIGS. 5A and 5B illustrate principal responses of boundary acoustic waves as well as those described in the above results. Since the first and second insulating films are made of SiN and therefore have a sound velocity extremely greater than that of $LiNbO_3$, the energy of vibration is distributed in the piezoelectric substrate 2 and boundary acoustic waves propagating along the first and second surfaces of the piezoelectric substrate are strongly combined with each other in a spurious response mode.

Figure 5C:
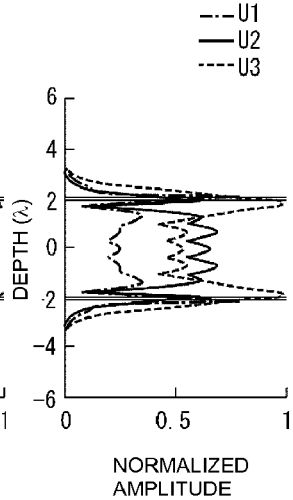
Figure 5D:
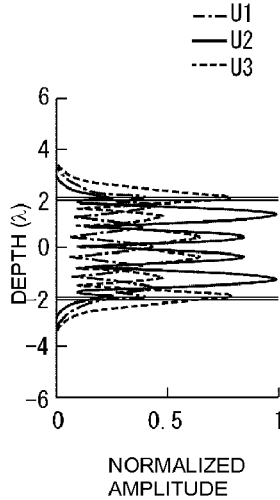

FIGS. 5C and 5D illustrate spurious modes. The energy of vibration is trapped between the first and second insulating films 5 and 6. A boundary acoustic wave propagating along the first surface 2a is strongly combined with a boundary acoustic wave propagating along the second surface 2b. These calculation conditions suggest that there are many higher spurious modes other than the spurious modes shown in FIGS. 5C and 5D and therefore good characteristics cannot be obtained.

Figure 6:
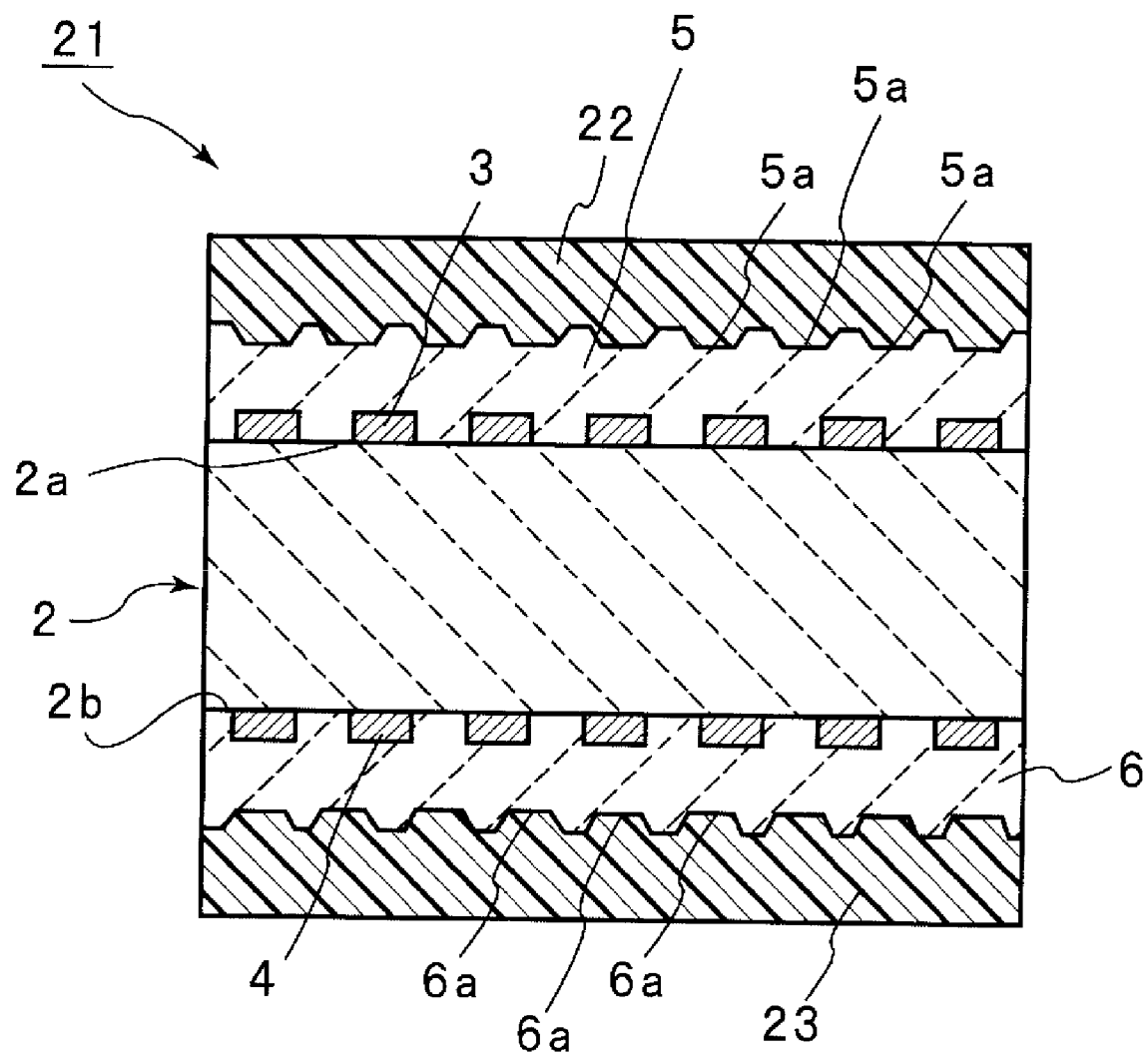
FIG. 6 is a schematic front sectional view of a boundary acoustic wave device according to a second preferred embodiment of the present invention.

FIG. 6 is a schematic front sectional view of a boundary acoustic wave device according to a second preferred embodiment of the present invention. The boundary acoustic wave device 21 has substantially the same configuration as that of the boundary acoustic wave device 1 of the first preferred embodiment except that a sound-absorbing film 22 and a sound-absorbing film 23 are disposed on the outer surface of a first insulating film 5 and that of a second insulating film 6, respectively. The presence of the sound-absorbing films 22 and 23 on the outer surfaces of the first and second insulating films 5 and 6 is effective in preventing spurious modes. That is, the presence of the sound-absorbing films 22 and 23, which are made of an acoustic matching material, on the outer surfaces of the first and second insulating films 5 and 6 is effective in preventing spurious modes. A material for forming the sound-absorbing films 22 and 23 absorbs spurious sounds and is not particularly limited. Examples of such a material include synthetic resins such as epoxy resins, polyimide, polyurethane, and silicone resins; SOG (spin-on-glass), and liquid-crystalline polymers.

A method for manufacturing a boundary acoustic wave device according to a third preferred embodiment of the present invention will now be described.

Figure 7A:
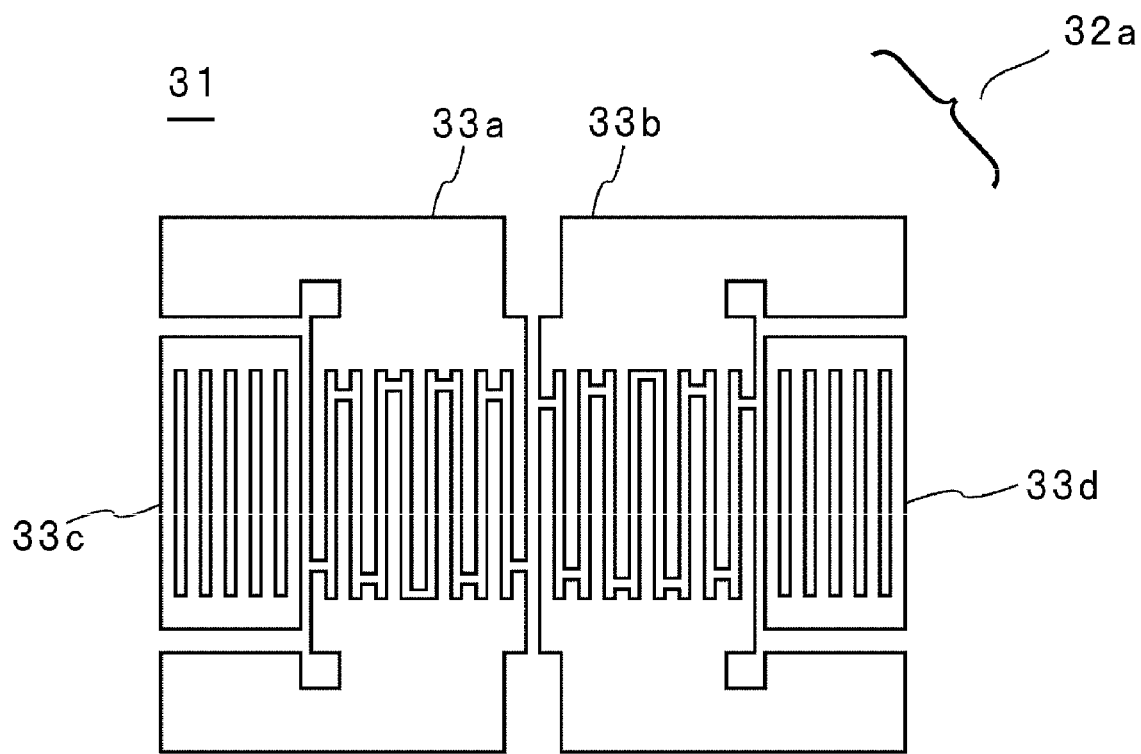
FIGS. 7A and 7B are illustrations showing the structures of electrodes disposed on a first surface and second surface of a boundary acoustic wave device according to a third preferred embodiment of the present invention.
Figure 7B:
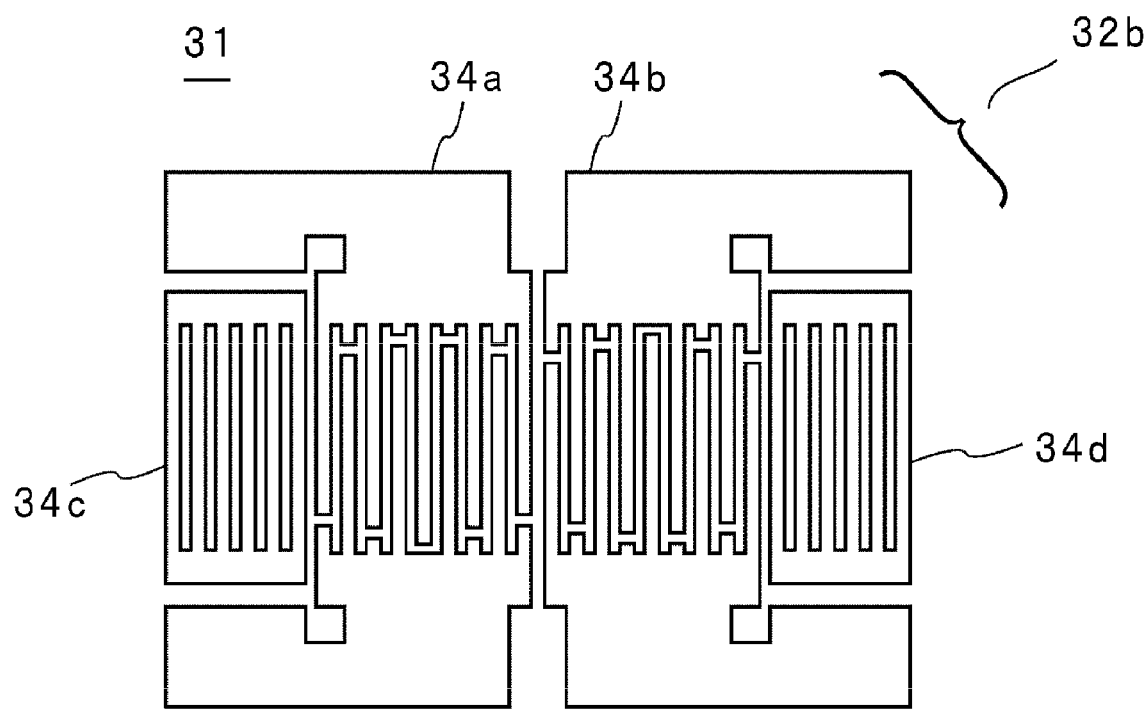
Figure 8:
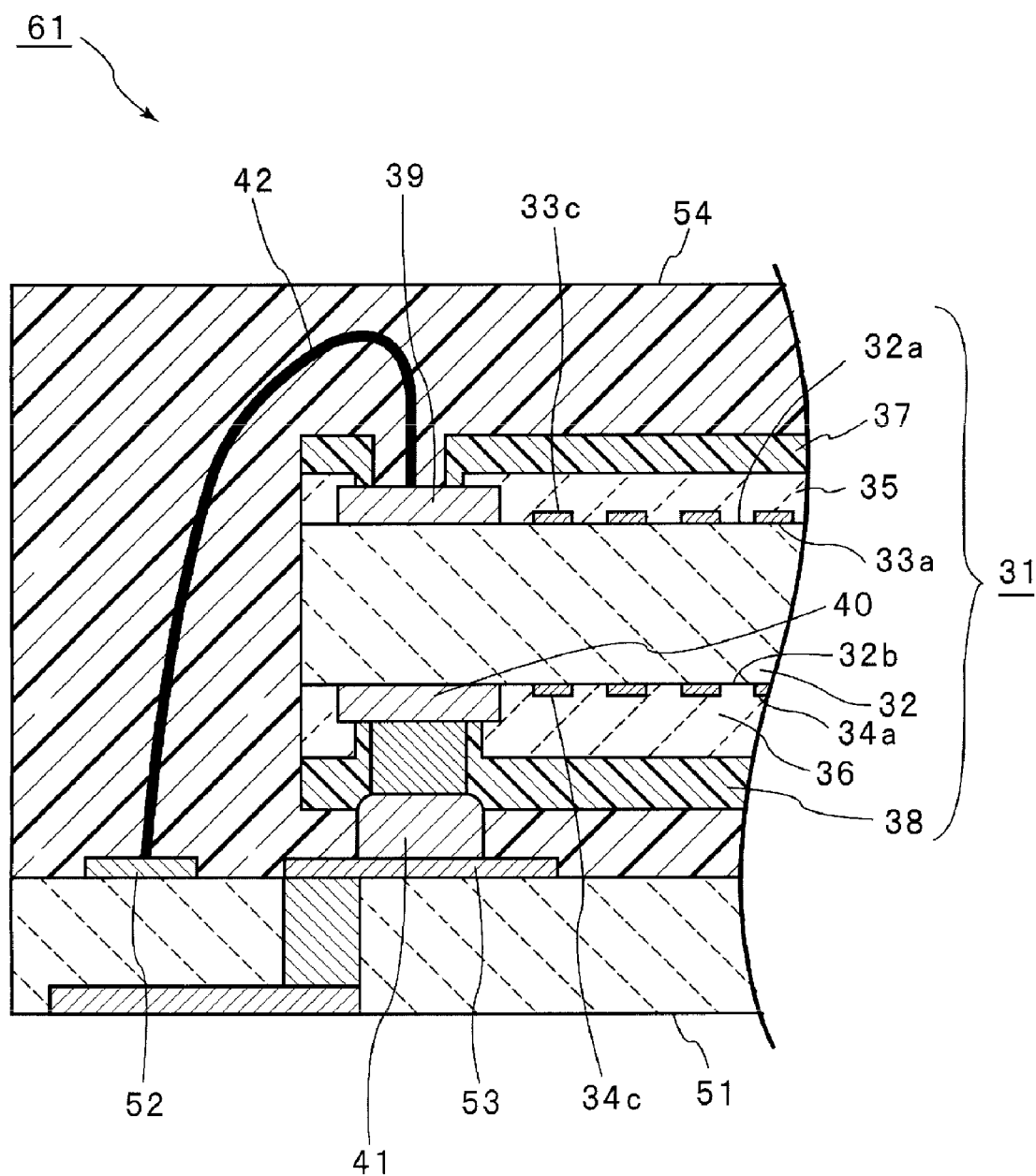
FIG. 8 is an enlarged front sectional view of a principal part of the boundary acoustic wave device according to the third preferred embodiment.
Figure 9:
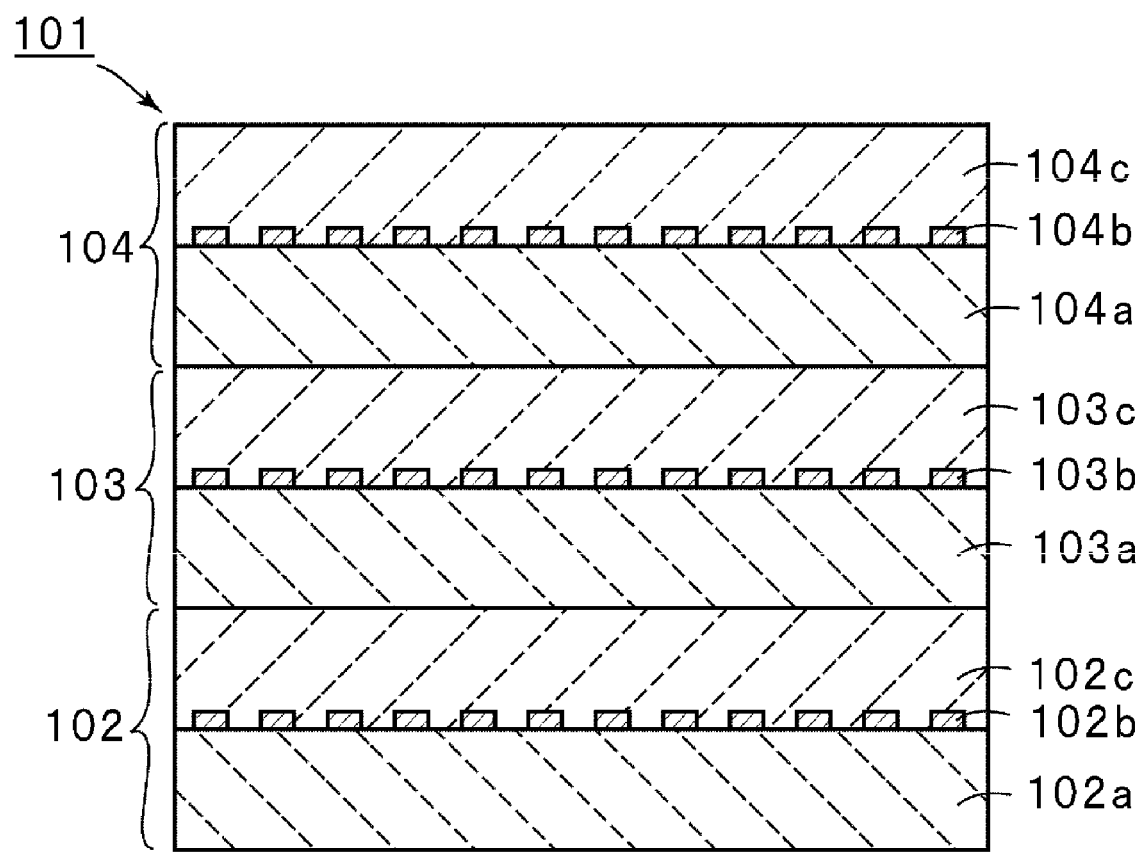
FIG. 9 is a front sectional view of a conventional boundary acoustic wave device.

FIGS. 7A and 7B are schematic plan views showing electrode structures of the boundary acoustic wave device of the third preferred embodiment. FIG. 8 is an enlarged front sectional view of a principal portion of the boundary acoustic wave device of the third preferred embodiment.

The boundary acoustic wave device 61 of the third preferred embodiment includes a piezoelectric substrate 32 having a first surface 32a and also includes two first IDT electrodes 33a and 33b disposed on the first surface 32a as shown in FIG. 7A. The first IDT electrodes 33a and 33b are arranged in a direction in which boundary acoustic waves propagate. Reflectors 33c and 33d are arranged on both sides of a region containing the first IDT electrodes 33a and 33b in the boundary acoustic wave-propagating direction, thereby forming a longitudinal-mode resonator-type boundary acoustic wave filter that is of a double IDT electrode type.

With reference to FIG. 8, second IDT electrodes 34a and 34b are disposed on the lower surface of the piezoelectric substrate 32. With reference to FIG. 7B, a longitudinal-mode resonator-type boundary acoustic wave filter that is of a double IDT electrode type is disposed on a second surface 32b. The second IDT electrodes 34a and 34b are also arranged in the boundary acoustic wave-propagating direction. Reflectors 34c and 34d are arranged on both sides of a region containing the second IDT electrodes 34a and 34b.

With reference to FIG. 8, a first insulating film 35 and second insulating film 36 made of $SiO_2$ extend over the first IDT electrodes 33 and the second IDT electrodes 34, respectively. In this preferred embodiment, sound-absorbing films 37 and 38 made of a hard epoxy resin are disposed on the insulating films 35 and 36, respectively.

With reference to FIG. 8, components of the boundary acoustic wave device 61 are mounted on a mounting board 51 and are sealed with resin. The method of the third preferred embodiment will now be described in detail.

Electrodes including the IDT electrodes 33a and 33b are formed on a first surface of a $LiNbO_3$ piezoelectric wafer by photolithography.

$SiO_2$ is formed on a first surface of the piezoelectric wafer so as to cover the IDT electrodes 33a and 33b by sputtering, whereby a protective layer with a thickness of about 1 μm is formed.

Electrodes including the IDT electrodes 34a and 34b are formed on the rear surface, that is, a second surface of the piezoelectric wafer by photolithography. $SiO_2$ is formed on both surfaces of the piezoelectric wafer by sputtering, whereby the first and second insulating films 35 and 36 are formed.

In this preferred embodiment, $SiO_2$ is formed on both surfaces of the piezoelectric wafer at a height of about 6 μm. The silicon film on the first surface of the piezoelectric wafer includes the protective layer and has a thickness of about 7 μm.

Resist layers are formed on the first and second insulating films 35 and 36 on both surfaces of the piezoelectric wafer by photolithography and are then treated by reactive ion etching (RIE) or the like, whereby holes are formed on external connection electrode pads 39 and 40. That is, the holes are formed such that the external connection electrode pads 39 and 40 are exposed. The epoxy resin is applied over both surfaces of the piezoelectric wafer and is then cured, whereby the sound-absorbing films 37 and 38 are formed.

Holes are formed in the sound-absorbing films 37 and 38 with a laser, whereby the external connection electrode pads 39 and 40 are exposed again. A layer for preventing solder erosion is formed on each external connection electrode pad 40.

After a solder bump 41 is formed as shown in FIG. 8, the piezoelectric wafer is diced, whereby a boundary acoustic wave element 31 is prepared.

The boundary acoustic wave element 31 is mounted on the mounting board 51 by flip-chip bonding using the solder bump 41. The external connection electrode pad 39 on the first surface 32a is electrically connected to an electrode 52 disposed on the mounting board 51 with a bonding wire 42. The solder bump 41 is bonded to an electrode 53 disposed on the mounting board 51 by flip-chip bonding.

The boundary acoustic wave element 31 is sealed with a molding resin 54. The mounting board is diced, whereby the boundary acoustic wave device 61 is obtained. The boundary acoustic wave device is sealed and therefore has high environmental resistance.

The molding resin 54 can be selected from synthetic resins such as epoxy resins.

In the method of this preferred embodiment, only the single $LiNbO_3$ wafer, which is expensive, is used to prepare the piezoelectric substrate. Therefore, the boundary acoustic wave device has a smaller size and can be manufactured at lower cost as compared to structures each including a plurality of piezoelectric wafers bonded to each other.

The present invention is not limited to the longitudinal-mode resonator-type boundary acoustic wave filters and can be widely applied to various boundary acoustic wave filters such as a ladder filter, a transverse-mode resonator-type filter, and a transverse boundary acoustic wave filter and various boundary acoustic wave devices such as a boundary acoustic wave resonator.

The IDT electrodes may be made of an electrode material such as Al, Pt, Ag, Cu, Ni, Ti, Fe, W, or Ta other than Au. In order to allow the IDT electrodes to have high adhesion and high electricity resistance, the IDT electrodes may be prepared in such a manner that thin layers of Ti, Cr, Ni—Cr, Ni, and/or ZnO are stacked. That is, the thin layers may be arranged between the piezoelectric substrate and electrode layers, between the electrode layers, and/or between the electrode layers and the insulating films.

The electrodes including the IDT electrodes may have a single-layer structure or a multilayer structure including a plurality of electrode layers.

In this preferred embodiment, the piezoelectric substrate is used and the first and second dielectric films are disposed on the piezoelectric substrate. A dielectric substrate may be used instead of the piezoelectric substrate. In this case, a first and a second piezoelectric layer may be formed on the upper surface and lower surface of the dielectric substrate instead of the first and second dielectric films.

A material for forming the dielectric substrate is not particularly limited and the following materials can be used to form the dielectric substrate: $SiO_2$, Si, glass, SiC, AlN, and $Al_2O_3$. Various dielectric materials can be used to form the dielectric substrate other than the above materials having no piezoelectric characteristics.

A piezoelectric material for forming the piezoelectric layers, which are formed on the dielectric substrate instead of the dielectric films, is not particularly limited. The following materials can be used to form the piezoelectric layers: a single crystal of $LiTaO_3$, $LiNbO_3$, or $KNbO_3$ and piezoelectric ceramic materials such as lead zirconate titanate.

The above piezoelectric materials can be used to form the piezoelectric substrate. The first and second dielectric films, which are disposed on the piezoelectric substrate, may be made of Si, glass, SiC, ZnO, $Ti_2O_5$, a lead zirconate titanate-containing piezoelectric ceramic material, AlN, $Al_2O_3$, $LiTaO_3$, $LiNbO_3$, or $KNbO_3$ instead of $SiO_2$.

The first and second dielectric films are made of a dielectric material and may be piezoelectric or non-piezoelectric.

The sound-absorbing films may be formed outside the first and second dielectric films and protective layers may be formed outside the sound-absorbing films. The following material can be used to form the protective layers: an organic material such as polyimide or an epoxy resin; an inorganic insulating material such as titanium oxide, aluminum nitride, or aluminum oxide; or a metal material such as Au, Al, or W.

The first and second dielectric films may have a multilayer structure including a plurality of dielectric sublayers. The first and second dielectric films preferably have a sound velocity less than that of the substrate. When the first and second dielectric films include dielectric sublayers having a sound velocity greater than that of the substrate, the high-sound velocity dielectric sublayers preferably have a relatively small thickness such that spurious modes are not trapped in the high-sound velocity dielectric sub-layers.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A boundary acoustic wave device comprising:
   a substrate having a first surface and a second surface opposed to the first surface;
   a first IDT electrode disposed on the first surface;
   a second IDT electrode disposed on the second surface;
   a first dielectric film extending over the first surface so as to cover the first IDT electrode; and
   a second dielectric film extending over the second surface so as to cover the second IDT electrode; wherein
   either the substrate or the first and second dielectric films have piezoelectric characteristics;
   the velocity of a slow transverse wave propagating in the substrate is greater than at least one of the velocity of a slow transverse wave propagating in the first dielectric film and the velocity of a slow transverse wave propagating in the second dielectric film; and
   the substrate has a thickness of about $3\lambda$ to about $100\lambda$ so as to prevent boundary acoustic waves propagating along the first surface from being combined with boundary acoustic waves propagating along the second surface.

2. The boundary acoustic wave device according to claim 1, wherein at least one of the first and second dielectric films has a surface which is opposed to the substrate and which has at least one of a recessed portion and a projecting portion, or both.

3. The boundary acoustic wave device according to claim 1, further comprising a sound-absorbing film disposed on one of the first and second dielectric films.

4. The boundary acoustic wave device according to claim 1, wherein the substrate is piezoelectric and the first and second dielectric films are insulative.

5. The boundary acoustic wave device according to claim 1, wherein the substrate is dielectric and the first and second dielectric films are piezoelectric.

6. The boundary acoustic wave device according to claim 1, wherein the substrate has a thickness of about $20\lambda$ to about $70\lambda$.

7. A method for manufacturing a boundary acoustic wave device, comprising:
   a step of preparing a wafer, having a first surface and a second surface opposed to the first surface, for forming a plurality of boundary acoustic wave devices;
   a step of forming a plurality of first IDT electrodes on the first surface of the wafer;
   a step of forming a plurality of second IDT electrodes on the second surface of the wafer;
   a step of forming a first dielectric film over the first surface of the wafer such that the first dielectric film covers the first IDT electrodes;
   a step of forming a second dielectric film over the second surface of the wafer such that the second dielectric film covers the second IDT electrodes; and
   a step of dicing the wafer subsequently to the formation of the first and second dielectric films to prepare each boundary acoustic wave device; wherein
   the velocity of a slow transverse wave propagating in the substrate is greater than at least one of the velocity of a slow transverse wave propagating in the first dielectric film and the velocity of a slow transverse wave propagating in the second dielectric film; and
   the substrate has a thickness of about $3\lambda$ to about 100 so as to prevent boundary acoustic waves propagating along the first surface from being combined with boundary acoustic waves propagating along the second surface.

8. The method for manufacturing a boundary acoustic wave device according to claim 7, wherein the substrate has a thickness of about $20\lambda$ to about $70\lambda$.

* * * * *